United States Patent
Cheng

(10) Patent No.: US 11,139,450 B2
(45) Date of Patent: Oct. 5, 2021

(54) DISPLAY SUBSTRATE AND MANUFACTURING METHOD THEREFOR, AND DISPLAY DEVICE

(71) Applicant: BOE TECHNOLOGY GROUP CO., LTD., Beijing (CN)

(72) Inventor: Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/338,165

(22) PCT Filed: Jun. 7, 2018

(86) PCT No.: PCT/CN2018/090203
§ 371 (c)(1),
(2) Date: Mar. 29, 2019

(87) PCT Pub. No.: WO2019/041946
PCT Pub. Date: Mar. 7, 2019

(65) Prior Publication Data
US 2019/0280246 A1 Sep. 12, 2019

(30) Foreign Application Priority Data

Aug. 31, 2017 (CN) .......................... 201721106739.6

(51) Int. Cl.
*H01L 21/00* (2006.01)
*H01L 51/52* (2006.01)
*H01L 27/32* (2006.01)

(52) U.S. Cl.
CPC .......... *H01L 51/5253* (2013.01); *H01L 27/32* (2013.01); *H01L 27/3281* (2013.01); *H01L 51/52* (2013.01); *H01L 51/5203* (2013.01)

(58) Field of Classification Search
CPC ...... H01L 51/5253; H01L 27/32; H01L 51/52
See application file for complete search history.

(56) References Cited

U.S. PATENT DOCUMENTS 10,224,383 B2    3/2019    Park et al.
10,249,844 B2 *  4/2019    Chou .................. H01L 51/5253
(Continued)

FOREIGN PATENT DOCUMENTS

CN    102664239 A    9/2012
CN    105810710 A    7/2016
(Continued)

OTHER PUBLICATIONS

International Search Report of PCT/CN2018/090203 in Chinese, dated Sep. 17, 2018, with English translation.
(Continued)

*Primary Examiner* — Laura M Menz
(74) *Attorney, Agent, or Firm* — Collard & Roe, P.C.

(57) ABSTRACT

A display substrate, a manufacturing method thereof and a display device. The display substrate includes a base, at least one protrusion arranged on the base and a packaging layer, the a base includes a display region and a non-display region positioned around the display region, at least one protrusion is arranged on the base in the non-display region, the protrusion is positioned between the base and the packaging layer and the packaging layer covers at least a portion of the protrusion.

18 Claims, 4 Drawing Sheets

(56) References Cited

U.S. PATENT DOCUMENTS

| | | |
|---|---|---|
| 10,622,586 B2 | 4/2020 | Kang |
| 10,749,140 B2* | 8/2020 | Park .................... H01L 51/5256 |
| 2002/0021390 A1 | 2/2002 | Jang et al. |
| 2010/0084968 A1 | 4/2010 | Watanabe et al. |
| 2011/0012873 A1 | 1/2011 | Prest et al. |
| 2013/0334959 A1 | 12/2013 | Wang et al. |
| 2014/0131683 A1* | 5/2014 | Kim .................... H01L 51/5253 257/40 |
| 2015/0091030 A1* | 4/2015 | Lee ........................ H01L 51/56 257/91 |
| 2016/0033811 A1* | 2/2016 | Xu .................... G02F 1/133512 257/72 |
| 2016/0284770 A1* | 9/2016 | Kim .................... H01L 27/3223 |
| 2016/0336541 A1* | 11/2016 | Kim ...................... H01L 27/124 |
| 2016/0351640 A1 | 12/2016 | Lee et al. |
| 2016/0365395 A1* | 12/2016 | Xu ...................... H01L 51/5256 |
| 2017/0033312 A1* | 2/2017 | Kim .................... H01L 27/3276 |
| 2017/0053973 A1* | 2/2017 | Park .................... H01L 27/3246 |
| 2017/0069873 A1* | 3/2017 | Kim ...................... H01L 51/525 |
| 2017/0285424 A1* | 10/2017 | Kwak .................. G02F 1/13624 |
| 2017/0346036 A1* | 11/2017 | Kim .................... H01L 51/5212 |
| 2019/0280246 A1* | 9/2019 | Cheng ................ H01L 27/3281 |
| 2020/0035946 A1* | 1/2020 | Cheng ................ H01L 27/3244 |

FOREIGN PATENT DOCUMENTS

| | | |
|---|---|---|
| CN | 106469746 A | 3/2017 |
| CN | 207116481 U | 3/2018 |
| KR | 10-2016-0000853 A | 1/2016 |
| KR | 10-2017-0023268 A | 3/2017 |
| TW | 201503350 A | 1/2015 |

OTHER PUBLICATIONS

Notice of Transmittal of the International Search Report of PCT/CN2018/090203 in Chinese, dated Sep. 17, 2018.

Written Opinion of the International Searching Authority of PCT/CN2018/090203 in Chinese, dated Sep. 17, 2018 with English translation.

Russian Office Action in Russian Application No. 2019136873/28(072910), dated Feb. 3, 2020 with English translation.

Korean Office Action in Korean Application No. 10-2019-7034395, dated Nov. 25, 2020 with English translation.

Indian Office Action in Indian Application No. 201917044688 dated Feb. 25, 2021.

English translation of Extended European Search Report in EP Application No. 18851736.1 dated Mar. 26, 2021.

\* cited by examiner

DISPLAY SUBSTRATE AND MANUFACTURING METHOD THEREFOR, AND DISPLAY DEVICE

CROSS REFERENCE TO RELATED APPLICATIONS

This application is the National Stage of PCT/CN2018/090203 filed on Jun. 7, 2018, which claims priority under 35 U.S.C. § 119 of Chinese Application No. 201721106739.6 filed on Aug. 31, 2017, the disclosure of which is incorporated by reference.

TECHNICAL FIELD

At least one embodiment of the present disclosure relates to a display substrate and a manufacturing method thereof, and a display device.

BACKGROUND

An Organic Light-Emitting Diode (OLED) is an organic thin film electroluminescent device, which receives great attention from people due to advantages of simple preparation process, low cost, low power consumption, high brightness, wide viewing angle, high contrast, capability of implementing flexible display and the like.

However, components in an OLED electronic display product may be damaged due to influence of water vapor, oxygen and the like which permeate into the OLED electronic display product, resulting in that performance of the OLED electronic display product is degraded and a service life thereof is shortened.

SUMMARY

At least one embodiment of the present disclosure provides a display substrate, comprising: a base, including a display region and a non-display region positioned around the display region; at least one protrusion, arranged on the base in the non-display region; and a packaging layer, arranged on the base, the protrusion being positioned between the base and the packaging layer, and the packaging layer covering at least a portion of the protrusion.

For example, in the display substrate provided by at least one embodiment of the present disclosure, the display substrate further comprises an insulating layer arranged between the protrusion and the base, the protrusion being positioned between the insulating layer and the packaging layer.

For example, in the display substrate provided by at least one embodiment of the present disclosure, the insulating layer is a passivation layer, and the protrusion is in contact with the passivation layer.

For example, in the display substrate provided by at least one embodiment of the present disclosure, the insulating layer is an interlayer insulating layer, and the protrusion is in contact with the interlayer insulating layer.

For example, in the display substrate provided by at least one embodiment of the present disclosure, the base in the display region includes a plurality of pixel regions, at least one organic light-emitting diode is arranged on the base in each of the plurality of pixel regions, and the organic light-emitting diode is positioned between the insulating layer and the packaging layer.

For example, in the display substrate provided by at least one embodiment of the present disclosure, the display substrate further comprises a pixel defining layer arranged on the base, the organic light-emitting diode being arranged in a region defined by the pixel defining layer.

For example, in the display substrate provided by at least one embodiment of the present disclosure, at least a portion of the protrusion is configured to be positioned on a same layer as the pixel defining layer and be manufactured from a same material with the pixel defining layer.

For example, in the display substrate provided by at least one embodiment of the present disclosure, the protrusion is configured to be a lamination at least including a first protrusion layer and a second protrusion layer, and the first protrusion layer is positioned between the second protrusion layer and the base, wherein the first protrusion layer is configured to be positioned on a same layer as the pixel defining layer and be manufactured from a same material with the pixel defining layer.

For example, in the display substrate provided by at least one embodiment of the present disclosure, a preparation material of the second protrusion layer is a photoresist material.

For example, in the display substrate provided by at least one embodiment of the present disclosure, a preparation material of the protrusion includes the photoresist material.

For example, in the display substrate provided by at least one embodiment of the present disclosure, the display substrate further comprises a planarization layer arranged on one side of the insulating layer, which is away from the base, wherein the planarization layer is positioned between the protrusion and the insulating layer.

For example, in the display substrate provided by at least one embodiment of the present disclosure, an orthogonal projection of the protrusion on the base is positioned within an orthogonal projection of the planarization layer on the base.

For example, in the display substrate provided by at least one embodiment of the present disclosure, at least a portion of the protrusion is configured to be positioned on a same layer as the planarization layer and be manufactured from a same material with the planarization layer.

For example, in the display substrate provided by at least one embodiment of the present disclosure, the protrusion is configured to be a lamination at least including a first protrusion layer, a second protrusion layer and a third protrusion layer, the first protrusion layer is positioned between the second protrusion layer and the base, and the third protrusion layer is positioned between the first protrusion layer and the base, wherein the first protrusion layer is configured to be positioned on a same layer as the pixel defining layer and be manufactured from a same material with the pixel defining layer, and the third protrusion layer is configured to be positioned on a same layer as the planarization layer and be manufactured from a same material with the planarization layer.

For example, in the display substrate provided by at least one embodiment of the present disclosure, a preparation material of the second protrusion layer is a photoresist material.

For example, in the display substrate provided by at least one embodiment of the present disclosure, the protrusion is set to be of a ring-shaped structure and surrounds the display region, wherein the protrusion is set to be of an integrated closed ring-shaped structure; or the protrusion is set to include at least two protrusion segments spaced from each other.

For example, in the display substrate provided by at least one embodiment of the present disclosure, on a same side of the displays substrate, a ratio of a length of the protrusion segment to a side length of the display substrate is not smaller than one third.

For example, in the display substrate provided by at least one embodiment of the present disclosure, the protrusion at least includes a first protrusion and a second protrusion which are sequentially arranged around the display region, the first protrusion and the second protrusion are adjacently arranged, and the first protrusion is positioned inside the second protrusion.

For example, in the display substrate provided by at least one embodiment of the present disclosure, in a direction perpendicular to a plane where the base is positioned, a height of the second protrusion is greater than that of the first protrusion.

For example, in the display substrate provided by at least one embodiment of the present disclosure, a difference between the height of the second protrusion and the height of the first protrusion is 0.5 to 3 microns.

For example, in the display substrate provided by at least one embodiment of the present disclosure, the height of the protrusion is 2 to 15 microns; and/or in a direction parallel to the plane where the base is positioned, a width of the protrusion is 30 to 100 microns; and/or in the direction parallel to the plane where the base is positioned, a spacing between the first protrusion and the second protrusion is 30 to 100 microns.

For example, in the display substrate provided by at least one embodiment of the present disclosure, the packaging layer is configured to be a lamination including a first packaging layer, a second packaging layer and a third packaging layer which are sequentially arranged on the base, preparation materials of the first packaging layer and the third packaging layer include an inorganic material, and a preparation material of the second packaging layer includes an organic material.

For example, in the display substrate provided by at least one embodiment of the present disclosure, the first packaging layer and the third packaging layer are configured to cover the protrusion; and the orthogonal projection of the protrusion on the base is positioned outside an orthogonal projection of the second packaging layer on the base.

At least one embodiment of the present disclosure provides a display device, comprising the display substrate as any mentioned above.

At least one embodiment of the present disclosure provides a manufacturing method of a display substrate, comprising: providing a base, the base including a display region and a non-display region positioned around the display region; forming at least one protrusion in the non-display region of the base; and forming a packaging layer on the base, wherein the protrusion is formed between the base and the packaging layer, and the packaging layer covers at least a portion of the protrusion.

For example, in the a manufacturing method of a display substrate provided by at least one embodiment of the present disclosure, the manufacturing method further comprises: forming an insulating layer between the protrusion and the base, wherein the protrusion is in contact with the insulating layer, and the insulating layer is a passivation layer or an interlayer insulating layer.

For example, in the a manufacturing method of a display substrate provided by at least one embodiment of the present disclosure, the manufacturing method further comprises: forming a planarization layer on one side of the insulating layer, which is away from the base, the planarization layer being formed between the protrusion and the insulating layer, wherein at least a portion of the protrusion is configured to be positioned on a same layer as the planarization layer and be manufactured from a same material with the planarization layer.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE SIGNS

Figure 1:
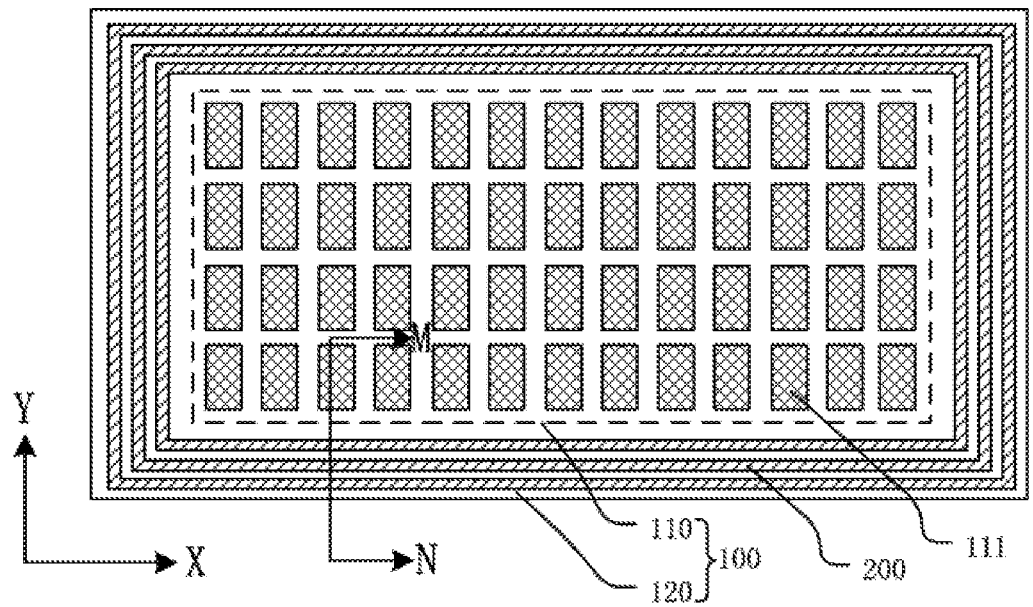
FIG. 1 is a plan view of a display substrate provided by an embodiment of the present disclosure.

100—base; 110—display region; 111—pixel region; 120—non-display region; 200—protrusion; 201—first protrusion layer; 202—second protrusion layer; 203—third protrusion layer; 210—first protrusion; 220—second protrusion; 230—protrusion segment; 231—first protrusion segment; 232—second protrusion segment; 300—packaging layer; 310—first packaging layer; 320—second packaging layer; 330—third packaging layer; 400—passivation layer; 500—planarization layer; 600—OLED; 610—first electrode; 620—second electrode; 630—organic light-emitting layer; 700—pixel defining layer; 800—thin film transistor; 810—gate insulating layer; 820—interlayer insulating layer.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Members, such as a light-emitting layer, a metal cathode and the like, in an OLED electronic display product are very sensitive to external substances such as water vapor, oxygen and the like in the air, and are easy to react with water, oxygen and the like permeating from the outside so as to influence performance of the OLED electronic display product and shorten the service life of the OLED electronic display product. Therefore, the OLED electronic display product needs to be packaged so as to improve protection on internal members of the OLED electronic display product.

One embodiment of the present disclosure provides a display substrate, the display substrate includes a base and at least one protrusion and a packaging layer which are arranged on the base, the base includes a display region and a non-display region positioned around the display region, the protrusion is arranged on the base in the non-display region, the packaging layer is arranged on the base; moreover, the protrusion is positioned between the base and the packaging layer, and the packaging layer at least partially covers the protrusion. In the non-display region, the protrusion increases a surface area of a surface of the packaging layer, which faces the base, and increases paths for substances such as water, oxygen and the like to intrude into inside of the display substrate so as to protect components in the display substrate; in addition, arrangement of the protrusion increases a contact area between the packaging layer and the display substrate so as to improve firmness of the packaging layer arranged on the display substrate and improve the packaging effect of the display substrate.

Hereinafter, a display substrate and a manufacturing method thereof, and a display device according to at least one embodiment of the present disclosure will be illustrated in connection with the drawings.

Figure 2:
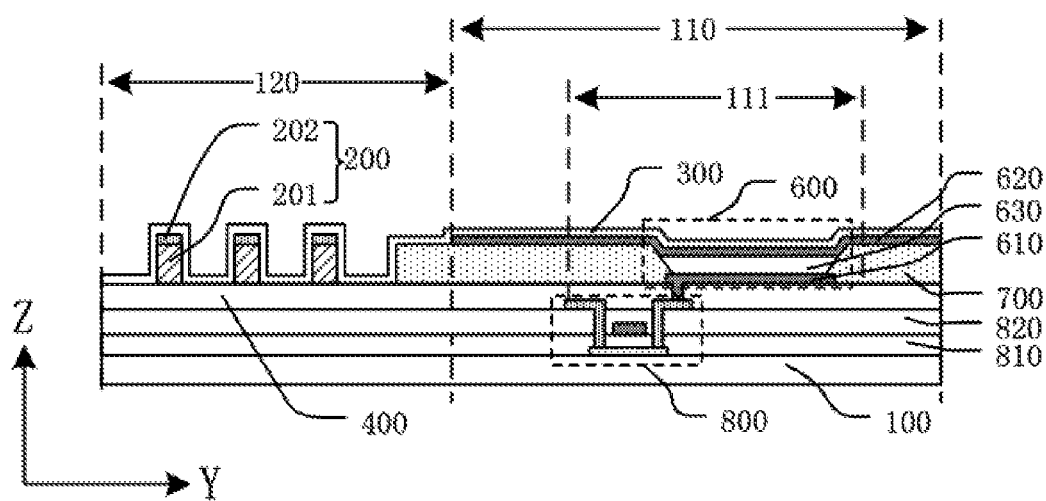
FIG. 2 is a sectional view of the display substrate shown in FIG. 1 along M-N.

At least one embodiment of the present disclosure provides a display substrate, FIG. 1 is a plan view of a display substrate provided by one embodiment of the present disclosure, and FIG. 2 is a sectional view of the display substrate shown in FIG. 1 along M-N. For example, as shown in FIG. 1 and FIG. 2, the display substrate includes a base 100 and a packaging layer 300 and at least one protrusion 200 which are arranged on the base 100, the base 100 includes a display region 110 and a non-display region 120 positioned around the display region, the protrusion 200 is arranged on the base 100 in the non-display region 120; moreover, the protrusion 200 is positioned between the base 100 and the packaging layer 300, and the packaging layer 300 at least partially covers the protrusion 200. As shown in FIG. 2, in the non-display region 120, the packaging layer 300 is arranged along the protrusion 200, so that a surface area of a surface of the packaging layer 300, which faces the base 100, is increased, paths for water and oxygen outside to enter inside of the display substrate are increased; moreover, an attachment area of the packaging layer 300 on the display substrate is increased, and the packaging effect of the display substrate is improved. For example, the packaging layer 300 may be set to cover all of the protrusion 200, i.e., an orthogonal projection of the protrusion 200 on the base 100 may be positioned within an orthogonal projection of the packaging layer 300 on the base 100. For example, the at least one protrusion continuously surround the display region. The at least one protrusion comprises at least two segments spaced from each other, the at least two segments are disposed to surround the display region.

The embodiments of the present disclosure do not make any limit to a preparation material of the base. For example, the preparation material of the base may be a glass substrate, a quartz substrate or a resin material, and the resin material, for example, includes one or more of polyimide, polycarbonate, polyacrylate, polyetherimide, polyethersulfone, polyethylene terephthalate, polyethylene naphthalate and the like.

For example, as shown in FIG. 1 and FIG. 2, a three-dimensional spatial rectangular coordinate system is set up by taking the base 100 in the display substrate as the reference so as to carry out directional designation on each component in the display substrate. In the above-mentioned three-dimensional spatial rectangular coordinate system, directions of an X axis and a Y axis are directions parallel to a plane where the base 100 is positioned, and a Z axis is in a direction perpendicular to the plane where the base 100 is positioned.

For example, in at least one embodiment of the present disclosure, the display substrate further includes an insulating layer arranged between the protrusion and the base, and the protrusion is positioned between the insulating layer and the packaging layer. The protrusion can increase the paths for water, oxygen and the like outside to intrude into the inside of the display substrate along an interface between the insulating layer and the packaging layer so as to improve the packaging effect of the display substrate.

Figure 6:
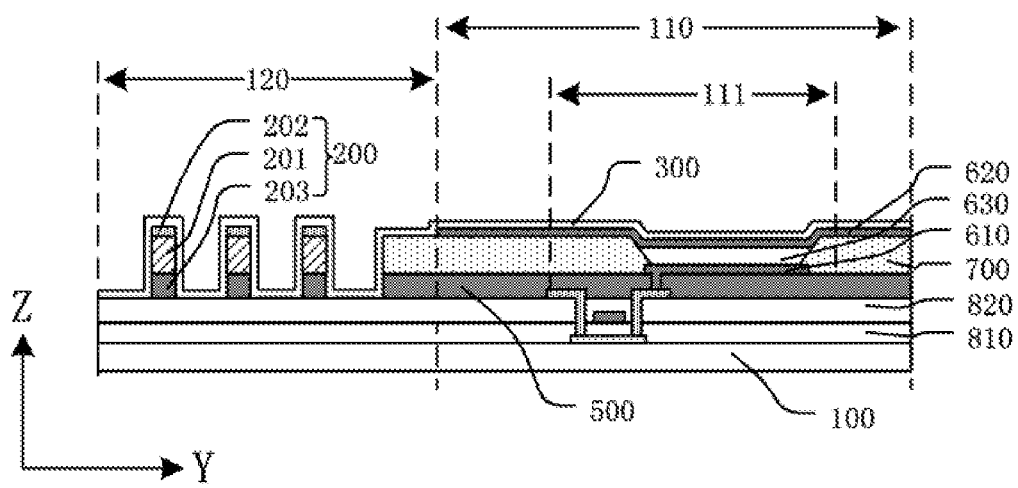
FIG. 6 is a partial sectional view of still another display substrate provided by an embodiment of the present disclosure.

For example, in some embodiments of the present disclosure, the insulating layer may be a passivation layer, and the protrusion is set to be in contact with the passivation layer. In a case that the insulating layer is the passivation layer, a structure of the display substrate may be as shown in FIG. 2. For example, in some other embodiments of the present disclosure, the insulating layer may be an interlayer insulating layer for electrical isolating a source-drain electrode of a thin film transistor and a gate electrode of the thin film transistor, and the protrusion is set to be in contact with the interlayer insulating layer. In a case that the insulating layer is the interlayer insulating layer, the structure of the display substrate may be as shown in FIG. 6.

Hereinafter, by taking the case that the insulating layer is the passivation layer as an example, the technical solution in at least one embodiment of the present disclosure as follows will be illustrated.

For example, in at least one embodiment of the present disclosure, as shown in FIG. 1 and FIG. 2, the display substrate further includes a protection passivation layer 400 arranged between the protrusion 200 and the base 100, and the protrusion 200 is positioned between the passivation layer 400 and the packaging layer 300. For example, the protrusion 200 is in contact with the passivation layer 400. The protection layer 400 for example may be a passivation layer for protecting the element in the substrate.

The embodiments of the present disclosure do not make any limit to a preparation material of the passivation layer 400. For example, the preparation material of the passivation layer 400 may include silicon nitride ($SiN_x$), silicon oxide ($SiO_x$), silicon oxynitride ($SiN_xO_y$) or other suitable materials.

For example, in at least one embodiment of the present disclosure, as shown in FIG. 1 and FIG. 2, the base 100 in the display region 110 includes a plurality of pixel regions 111, at least one OLED 600 is arranged on the base 100 in each pixel region 111, and the OLED 600 is positioned between the insulating layer (e.g., the passivation layer 400) and the packaging layer 300. The protrusion 200 may increase paths for water and oxygen to diffuse along the interface between the packaging layer 300 and the passivation layer 400, so that intrusion of water, oxygen and the like outside into the OLED 600 can be blocked or alleviated, thereby protecting the OLED 600. The embodiments of the present disclosure do not make any limit to a structure of the OLED 600. For example, in at least one embodiment of the present disclosure, as shown in FIG. 2, the OLED 600 may include a first electrode 610, a second electrode 620 and an organic light-emitting layer 630, and the organic light-emitting layer 630 is positioned between the first electrode 610 and the second electrode 620. The structure of the OLED 600 is not limited to the contents above, and for example, the OLED 600 may also include structures of a hole injection layer, a hole transport layer, an electron transport layer, an electron injection layer and the like which are positioned between the first electrode 610 and the second electrode 620, and further may also include a hole blocking layer and an electron blocking layer; the hole blocking layer, for example, may be arranged between the electron transport layer and the organic light-emitting layer; and the electron blocking layer, for example, may be arranged between the hole transport layer and the organic light-emitting layer.

The embodiments of the present disclosure do not make any limit to preparation materials of the first electrode 610 and the second electrode 620 in the OLED 600. For example, in at least one embodiment of the present disclosure, one of the first electrode 610 and the second electrode 620 may be an anode, and the other may be a cathode. The anode, for example, may be formed by a transparent conductive material with a high-work function, and electrode materials of the anode may include Indium Tin Oxide (ITO), Indium Zinc Oxide (IZO), Indium Gallium Oxide (IGO), Gallium Zinc Oxide (GZO), zinc oxide (ZnO), indium oxide ($In_2O_3$), Aluminum Zinc Oxide (AZO), carbon nanotubes and the like; and the cathode, for example, may be formed by a material with high electrical conductivity and a low-work function, and electrode materials of the cathode may include alloys such as a magnesium aluminum alloy (MgAl), a lithium aluminum alloy (LiAl) and the like or mono-metals such as magnesium, aluminum, lithium, silver and the like.

The embodiments of the present disclosure do not make any limit to a preparation material of the organic light-emitting layer 630 in the OLED 600. For example, in at least one embodiment of the present disclosure, the material of the organic light-emitting layer 630 may be selected according to different colors of light emitted by the organic light-emitting layer 630. For example, the preparation material of the organic light-emitting layer 630 includes a fluorescent luminescent material or a phosphorescent material. For example, in at least one embodiment of the present disclosure, the organic light-emitting layer 630 may adopt a doping system, i.e., a usable luminescent material is obtained by mixing a dopant material into a host luminescent material. For example, the host luminescent material may adopt a metal compound material, a derivative of anthracene, an aromatic diamine compound, a triphenylamine compound, an aromatic triamine compound, a biphenyl-diamine derivative, or a triarylamine polymer and the like.

For example, in at least one embodiment of the present disclosure, as shown in FIG. 2, the display substrate further may include a pixel defining layer 700 positioned on the base 100 and configured to define a region where the organic light-emitting diode 600 is located, and the OLED 600 is arranged in a region defined by the pixel defining layer 700.

The embodiments of the present disclosure do not make any limit to a specific structure, a preparation material and the like of the pixel defining layer 700. For example, in at least one embodiment of the present disclosure, the pixel defining layer 700 may be of a one-layer or two-layer structure, and may also be of a composite layer structure formed by multiple layers. For example, the pixel defining layer 700 at least may include a lamination of a first defining layer and a second defining layer, the first defining layer, for example, may be formed by a hydrophilic organic material, and the second defining layer, for example, may be formed by a hydrophobic organic material. The first defining layer is positioned between the base 100 and the second defining layer, and when part of structures (for example, the organic light-emitting layer 630 and the like) of the OLED 600 are prepared by inkjet printing for example, the first defining layer with hydrophilicity absorbs and fixes an inkjet material in the region defined by the pixel defining layer 700, the second defining layer with hydrophobicity enables the inkjet material falling onto the second defining layer to slide down and move into the region defined by the pixel defining layer 700, so that the yield of preparation of the display substrate can be promoted.

For example, in at least one embodiment of the present disclosure, the protrusion 200 in the display substrate may be configured to be manufactured on the same layer and from the same material with the pixel defining layer 700. For example, the protrusion 200 and the pixel defining layer 700 may be simultaneously formed by the same material in the same process. Exemplarily, in the process of manufacturing the pixel defining layer 700 on the base 100, a layer of pixel defining layer material is deposited on the base 100, and then a patterning process is performed to simultaneously form the pixel defining layer 700 and the protrusion 200, so that the number of masks can be reduced, production time of the display substrate can be shortened, and production cost of the display substrate can be reduced.

In the embodiments of the present disclosure, the preparation material of the pixel defining layer 700 may be a polymer resin material, and the patterning process, for example, may be a photolithographic patterning process and for example, may include: coating a photoresist film on a structural layer which needs to be patterned, wherein coating of the photoresist film may adopt a spin-coating, blade-coating or roller-coating mode; then carrying out exposure on the photoresist layer with a mask, and carrying out development on the exposed photoresist layer to obtain a photoresist pattern; then etching the structural layer by using the photoresist pattern as a mask; and finally, stripping off the residual photoresist to form a required pattern structure.

For example, in at least one embodiment of the present disclosure, the preparation material of the pixel defining layer 700 may also be a photoresist, and in such case, the patterning process includes: exposing the photoresist layer by using the mask, and developing the exposed photoresist to obtain patterns of the pixel defining layer 700 and the protrusion 200.

For example, in at least one embodiment of the present disclosure, at least a portion of the protrusion 200 in the display substrate may be configured to be manufactured on the same layer and from the same material with the pixel defining layer 700. As shown in FIG. 2, the protrusion 200 may be configured to be a lamination at least including a first protrusion layer 201 and a second protrusion layer 202, the first protrusion layer 201 is positioned between the second protrusion layer 202 and the base 100, the first protrusion layer 201, for example, may be configured to be manufactured on the same layer and from the same material with the pixel defining layer 700, and a preparation material of the second protrusion layer 202, for example, may be the photoresist.

For example, in one example of at least one embodiment of the present disclosure, the pixel defining layer 700 and the first protrusion layer 201 manufactured on the same layer and from the same material with the pixel defining layer 700 may be obtained by the same patterning process. The patterning process, for example, may be a photolithographic patterning process, and for example, may include: depositing one layer of pixel defining layer material, such as the polymer resin material, on the base 100, and coating the photoresist film on the pixel defining layer material, wherein coating of the photoresist film may adopt the spin-coating, blade-coating or roller-coating mode; then exposing the photoresist layer with the mask, and developing the exposed photoresist layer to obtain the photoresist pattern; then etching the pixel defining layer material by using the photoresist pattern as the mask to obtain the pixel defining layer 700 and the first protrusion layer 201 manufactured on the same layer and from the same material with the pixel defining layer 700; and manufacturing the second protrusion layer 202 by adopting the photoresist, depositing one layer of photoresist on the base 100 on which the pixel defining layer 700 and the first protrusion 201 are formed, and obtaining a pattern of the second protrusion layer 202 by exposure and development. Therefore, a height (the height of the protrusion 200 is a distance from one end of the protrusion, which is away from the base 100, to the other end of the protrusion 200, which is close to the base 100, and in FIG. 2, the height of the protrusion 200 is a distance from one end of the protrusion, which is away from the base 100, to the other end positioned on the passivation layer 400) of the protrusion 200 can be increased, so that the paths for water and oxygen to intrude into the inside of the display substrate are further increased.

For example, in another example of at least one embodiment of the present disclosure, the preparation material of the pixel defining layer 700 is the photoresist. For example, the process of obtaining the pixel defining layer 700 and the protrusion 200 manufactured on the same layer and from the same material with the pixel defining layer 700 by the same patterning process may include: depositing one layer of photoresist on the base 100, exposing the photoresist layer with the mask, developing the exposed photoresist to obtain the pixel defining layer 700 and the first protrusion layer 201 manufactured on the same layer and from the same material with the pixel defining layer 700, manufacturing the second protrusion layer 202 by adopting the photoresist, depositing one layer of photoresist on the base 100 on which the pixel defining layer 700 and the first protrusion layer 201 are formed, and obtaining the pattern of the second protrusion layer 202 by exposure and development. Therefore, the height (the height of the protrusion 200 is a distance from one end of the protrusion 200, which is away from the base 100, to the other end of the protrusion 200, which is close to the base 100, and in FIG. 2, the height of the protrusion 200 is a distance from one end of the protrusion 200, which is away from the base 100, to the other end positioned on the passivation layer 400) of the protrusion 200 can be increased, so that the paths for water and oxygen to intrude into inside of the display substrate are further increased.

For example, in at least one embodiment of the present disclosure, the protrusion 200 may also be manufactured without using the material on the same layer with the pixel defining layer, and exemplarily, after the pixel defining layer 700 is obtained by the patterning process, one layer of photoresist is deposited on the base 100 on which the pixel defining layer 700 is formed, and the pattern of the protrusion 200 is obtained by exposure and development.

In the embodiments of the present disclosure, the structural design of the protrusion 200 is not limited to the several above-mentioned combined modes, the protrusion 200 may be designed according to actual demands, and the embodiments of the present disclosure do not make any limit to a specific structure of the protrusion 200.

The embodiments of the present disclosure do not make any limit to a driving mode of the OLED 600 in the display substrate. For example, the OLED 600 in the display substrate may adopt active driving or passive driving.

For example, in at least one embodiment of the present disclosure, the OLED 600 in the display substrate adopts passive driving. As shown in FIG. 2, the first electrode 610 and the second electrode 620 in the OLED 600 are overlapped, the organic light-emitting layer 630 is positioned at an overlapped position of the first electrode 610 and the second electrode 620, and a driving circuit of the display substrate, for example, may be subjected to bonding in a connecting mode such as Tape Carrier Package (TCP) or Chip On Glass (COG) and the like.

For example, in at least one embodiment of the present disclosure, the OLED 600 in the display substrate adopts active driving. As shown in FIG. 2, at least one thin film transistor 800 is also arranged in each pixel region 111 in the display substrate so as to drive the OLED 600. For example, the thin film transistor 800 may include an active layer, a gate insulating layer 810, a gate electrode, an interlayer insulating layer 820, a source-drain electrode layer (including a source electrode and a drain electrode) and the like, and the drain electrode, for example, is electrically connected with the first electrode 610 in the OLED 600.

The embodiments of the present disclosure do not make any limit to the type and the structure of the thin film transistor 800. For example, the thin film transistor 800 may be a top-gate type thin film transistor, a bottom-gate type thin film transistor or a double-gate type thin film transistor and the like. For example, the display substrate may be a bottom-emitting or top-emitting mode, and may also adopt double-sided emitting mode. For example, the display substrate adopts the bottom-emitting mode, the first electrode 610 (for example, an anode) of the display substrate may be a transparent electrode, for example, an ITO electrode, and the second electrode 620 (for example, a cathode) of the display substrate may be an opaque metal electrode; and when the display substrate adopts the top-emitting mode, the first electrode 610 (for example, the anode) of the display substrate may adopt a reflective electrode, and the second electrode 620 (for example, the cathode) may adopt a translucent electrode.

Figure 3A:
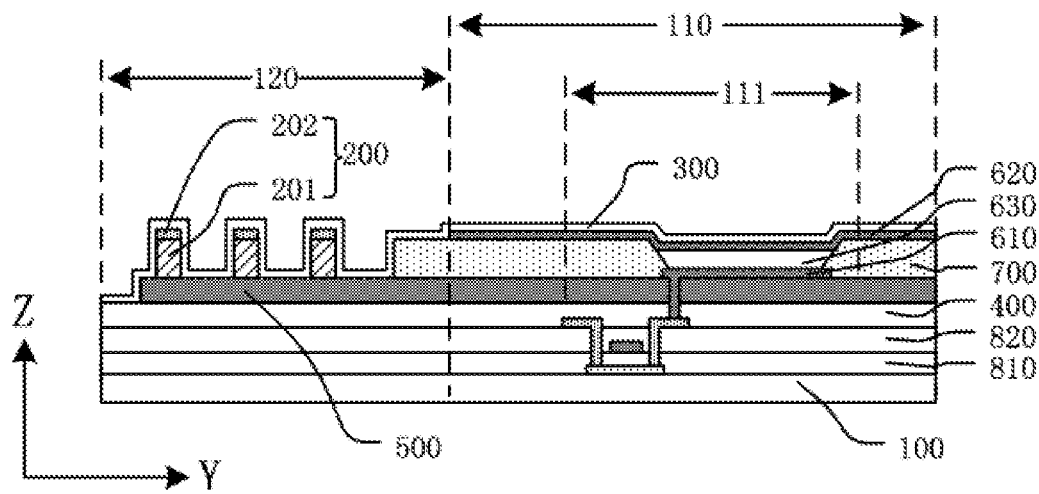
FIG. 3A is a partial sectional view of another display substrate provided by an embodiment of the present disclosure.

For example, in at least one embodiment of the present disclosure, FIG. 3A is a partial sectional view of another display substrate provided by an embodiment of the present disclosure. For example, as shown in FIG. 3A, the display substrate may further include a planarization layer 500 arranged on one side of the passivation layer 400, which is away from the base 100. In the manufacturing process of the display substrate, the planarization layer 500 can planarize the display substrate so as to facilitate subsequent processes.

For example, in at least one embodiment of the present disclosure, as shown in FIG. 3A, in a direction of the Z axis, an orthogonal projection of the protrusion 200 on the base 100 is positioned within an orthogonal projection of the planarization layer 500 on the base 100, i.e., the planarization layer 500 extends to the non-display region 120 and extends to a region where the protrusion 200 is arranged. The height of the protrusion 200 is the distance from one end of the protrusion 200, which is away from the base 100, to the other end of the protrusion 200, which is close to the base 100, and in FIG. 3A, the height of the protrusion 200 is the distance from one end of the protrusion 200, which is away from the base 100, to the other end positioned on the planarization layer 500.

Figure 3B:
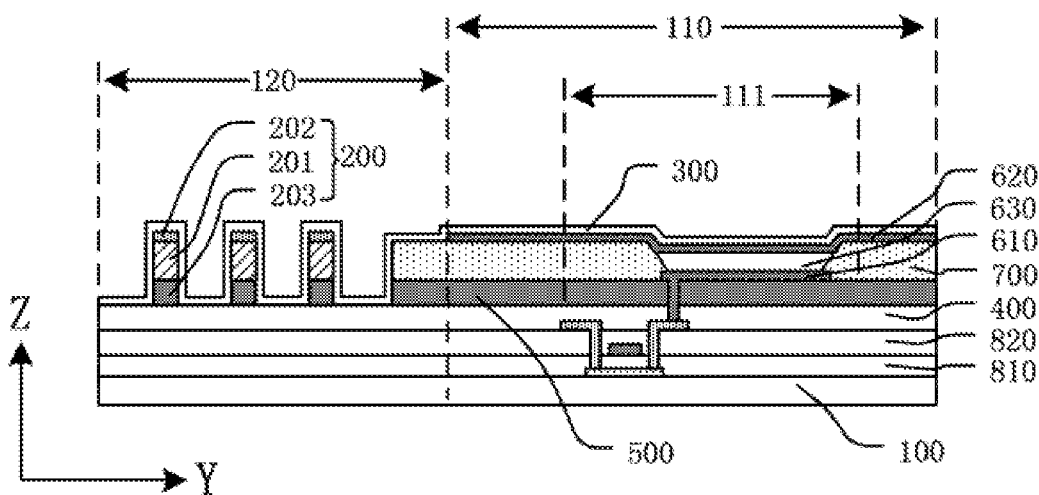
FIG. 3B is a partial sectional view of yet another display substrate provided by an embodiment of the present disclosure.

For example, in at least one embodiment of the present disclosure, a portion of the planarization layer 500, which is positioned in the non-display region 120, may also be subjected to patterning design, so that the planarization layer 500 in this region is configured to be a partial structure of the protrusion 200. FIG. 3B is a partial sectional view of yet another display substrate provided by an embodiment of the present disclosure. For example, as shown in FIG. 3B, the planarization layer 500 in the non-display region 120 may be subjected to patterning process treatment, and the residual planarization layer 500 is used as one portion in the protrusion 200, e.g., a third protrusion layer 203, so that the height of the protrusion 200 can be increased, the height of the protrusion 200 is the distance from one end of the protrusion 200, which is away from the base 100, to the other end of the protrusion 200, which is close to the base 100, and in FIG. 3B, the height of the protrusion 200 is the distance from one end of the protrusion 200, which is away from the base 100, to the other end positioned on the passivation layer 400, and thus, the paths for water and oxygen to intrude can be further increased, and the packaging effect of the display substrate can be improved.

The embodiments of the present disclosure do not make any limit to a preparation material of the planarization layer 500. For example, the preparation material of the planarization layer 500 may be an organic material, e.g., epoxy resin, polyimide, polyamide, acrylic acid or other suitable materials. For example, the preparation material of the planarization layer 500 may be the photoresist, one layer of photoresist is deposited on the base 100 on which the passivation layer 400 is formed, and the photoresist is subjected to exposure and development to form patterns of the planarization layer 500 and the third protrusion layer 203.

The embodiments of the present disclosure do not make any limit to a structure of the packaging layer 300, as long as the packaging layer 300 at least partially covers the protrusion 200.

For example, in at least one embodiment of the present disclosure, as shown in FIG. 2, FIG. 3A and FIG. 3B, the packaging layer 300 in the non-display region 120 has a non-flat portion corresponding to the protrusion 200. The paths for water and oxygen to enter the inside of the display substrate can be increased, and an effect of improving the packaging effect of the display substrate can be taken.

For example, in at least one embodiment of the present disclosure, as shown in FIG. 2, FIG. 3A and FIG. 3B, the packaging layer 300 may be a single-layer structure. For example, the packaging layer 300 may be set to cover the entire surface of the base 100 so as to protect members, e.g., the OLED 600, in the display substrate. A preparation material of the packaging layer 300 may be an inorganic material, and for example, may be silicon nitride ($SiN_x$), silicon oxide ($SiO_x$), silicon oxynitride ($SiN_xO_y$) or other suitable materials and the like.

Figure 4:
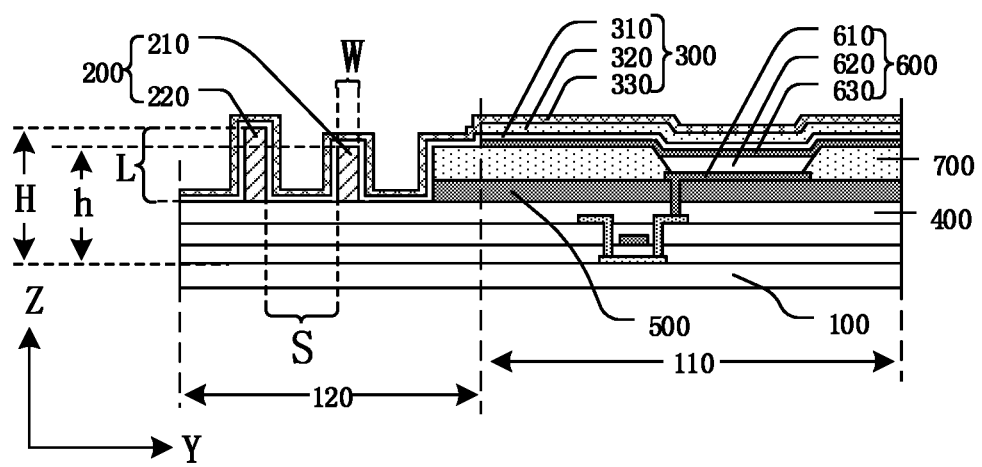
FIG. 4 is a partial sectional view of still another display substrate provided by an embodiment of the present disclosure.

For example, in at least one embodiment of the present disclosure, the packaging layer 300 may be of a composite structure of two layers or more than two layers. FIG. 4 is a partial sectional view of still another display substrate provided by an embodiment of the present disclosure. As shown in FIG. 4, the packaging layer 300, for example, may be a lamination including a first packaging layer 310, a second packaging layer 320 and a third packaging layer 330 which are sequentially arranged on the base 100. For example, preparation materials of the first packaging layer 310 and the third packaging layer 330 may include an inorganic material, e.g., materials of silicon nitride, silicon oxide and the like, and high compactness of the inorganic material can prevent intrusion of water, oxygen and the like; for example, a preparation material of the second packaging layer 320 includes an organic material, e.g., polymer resin and the like, the second packaging layer 320 can relieve stresses of the first packaging layer 310 and the third packaging layer 330, and materials such as a desiccant and the like may be arranged in the second packaging layer 320, so that substances of water, oxygen and the like which intrude into the inside can be absorbed and the components in the display substrate are protected.

For example, in at least one embodiment of the present disclosure, as shown in FIG. 4, the first packaging layer 310 and the third packaging layer 330 are configured to cover the entire display region 110 and at least cover the protrusion 200 in the non-display region 120, and for example, the first packaging layer 310 and the third packaging layer 330 are further configured to cover the entire surface of the base 100.

For example, in at least one embodiment of the present disclosure, as shown in FIG. 4, in a direction parallel to the Z axis, the orthogonal projection of the protrusion 200 on the base 100 is positioned outside an orthogonal projection of the second packaging layer 320 on the base 100. For example, the second packaging layer 320 does not extend to the region where the protrusion 200 is positioned. A thickness of the second packaging layer 320 formed by the organic material is large, and the second packaging layer 320 keeps away from the protrusion 200, so that regions on both sides of the protrusion 200 can be prevented from being filled in by the second packaging layer 320.

The embodiments of the present disclosure do not make any limit to a thickness of the packaging layer 300. For example, in at least one embodiment of the present disclosure, as shown in FIG. 4, in the direction parallel to the Z axis, thicknesses of the first packaging layer 310 and the third packaging layer 330 may be not greater than 1 micron, and the thickness of the second packaging layer 320 is 2 to 15 microns.

In the embodiments of the present disclosure, the arrangement mode of the protrusion 200 on the base 100 is not limited, as long as arrangement of the protrusion 200 can increase the paths for water, oxygen and the like to intrude into the inside of the display substrate.

For example, in at least one embodiment of the present disclosure, as shown in FIG. 1, the protrusion 200 may be set to be arranged partially around the display region 110, or may be set to be of a ring-shaped structure and arranged around the display region 110, wherein each protrusion 200 may be set to be of an integrated closed ring-shaped structure. Therefore, the protrusion 200 can protect components in the entire display region 110.

Figure 5:
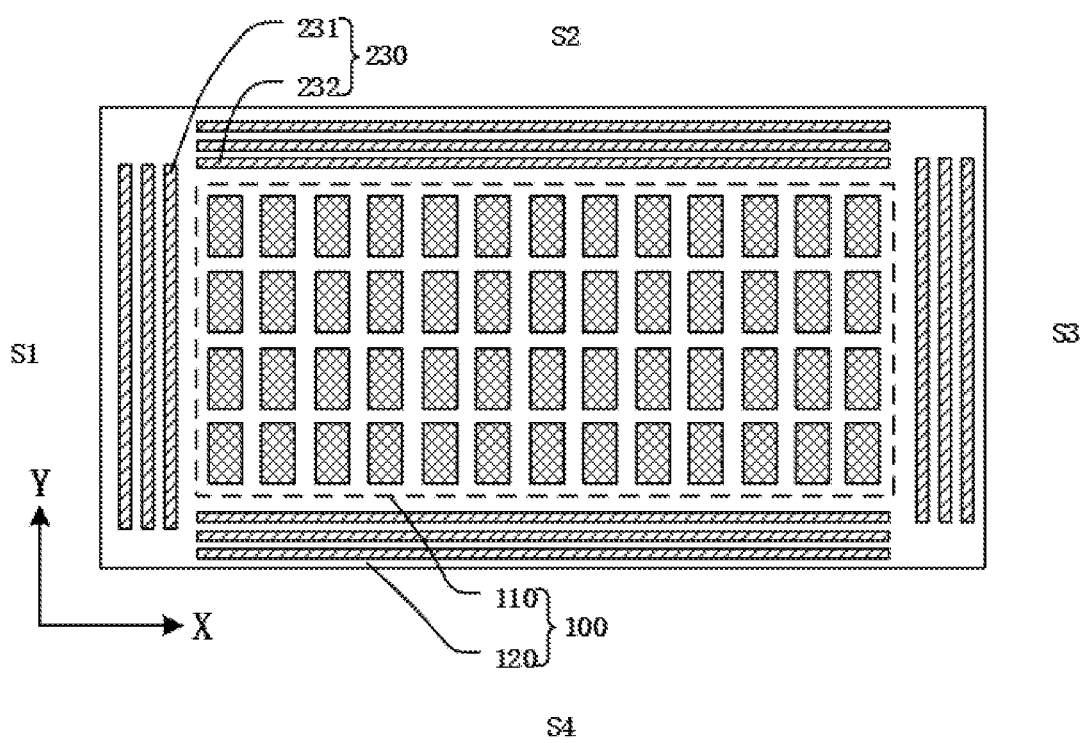
FIG. 5 is a plan view of still another display substrate provided by an embodiment of the present disclosure.

For example, in at least one embodiment of the present disclosure, FIG. 5 is a plan view of another display substrate provided by an embodiment of the present disclosure. As shown in FIG. 5, each protrusion 200 may be set to include at least two protrusion segments 230 (for example, including a first protrusion segment 231, a second protrusion segment 232 and the like) spaced from each other. The protrusion segment 230 may be arranged according to a specific structure of the display substrate so as to avoid causing the excessive thickness of the display substrate, resulting in a poor subsequent preparation process and the like.

The embodiments of the present disclosure do not make any limit to a length of the protrusion segment 230, and the length of the protrusion segment 230 may be designed according to actual process conditions. For example, as shown in FIG. 5, on the same side of the display substrate, a ratio of the length of the protrusion segment 230 to a side length of the display substrate is not smaller than 1/3 and further not smaller than 2/3. Exemplarily, for example, as shown in FIG. 5, on an S1 side of the display substrate, a ratio of an extension length of the first protrusion segment 231 in a direction parallel to Y axis to a side length of the S1 side of the display substrate is not smaller than 1/3; and on an S2 side of the display substrate, a ratio of an extension length of the second protrusion segment 232 in a direction parallel to X axis to a side length of the S2 side of the display substrate is not smaller than 1/3. Similarly, on an S3 side and an S4 side of the display substrate, a ratio of the length of the protrusion segment 230 to the side length of the display substrate is not smaller than 1/3.

The embodiments of the present disclosure do not make any limit to an extension shape of the protrusion 200 on the display substrate. For example, as viewed from a direction parallel to the Z axis, the extension shape (not including an extension shape of a bent segment) of the protrusion 200 (for example, the protrusion segment 230) in a direction parallel to the plane where the base 100 is positioned may be a linear shape, a wave shape and the like. Exemplarily, as shown in FIG. 5, an extension shape of the first protrusion segment 231 in a direction parallel to the Y axis or an extension shape of the second protrusion segment 232 in a direction parallel to the X axis is a linear shape.

For example, in at least one embodiment of the present disclosure, as shown in FIG. 4, in a direction parallel to the plane where the base 100 is positioned, multiple layers of protrusions 200 may be arranged around the display region 110. For example, in one embodiment of the present disclosure, as shown in FIG. 4, the protrusion 200 at least includes a first protrusion 210 and a second protrusion 220 which are sequentially arranged around the display region 110, the first protrusion 210 and the second protrusion 220 are adjacently arranged, and the first protrusion 210 is positioned inside the second protrusion 220. Multiply layers of protrusions 200 can further increase the paths for water and oxygen outside to intrude into the inside of the display substrate so as to further improve the packaging effect of the display substrate.

In the embodiments of the present disclosure, the heights of the protrusions 200 on different layers are not limited, and may be designed according to actual process conditions. For example, the height of the protrusion 200 positioned on the outer layer of the display substrate may be set to be greater than that of the protrusion 200 on the inner layer. Exemplarily, in a direction perpendicular to the plane where the base 100 is positioned, a height H of the second protrusion 220 is greater than a height h of the first protrusion 210. the height H of the second protrusion 220 is a distance from one end of the second protrusion 220, which is away from the base 100, to the other end of the second protrusion 220, which is close to the base 100, and in FIG. 4, the height of the second protrusion 220 is a distance from one end of the second protrusion 220, which is away from the base 100, to the other end positioned on the passivation layer 400; the height h of the first protrusion 210 is a distance from one end of the first protrusion 210, which is away from the base 100, to the other end of the first protrusion 210, which is close to the base 100, and in FIG. 4, the height of the first protrusion 210 is a distance from one end of the first protrusion 210, which is away from the base 100, to the other end positioned on the passivation layer 400; the first protrusion 210 and the second protrusion 220 have a height difference, which can reduce a depth of a groove formed between the first protrusion 210 and the second protrusion 220 and is beneficial for improving quality of a formed film when the packaging layer covers the first protrusion 210 and the second protrusion 220; and the height H of the second protrusion 220 on the outer layer is relatively large, so that the intruding path for water and oxygen can be increased, and the packaging effect of the display substrate can be improved.

In the embodiments of the present disclosure, the height difference between the adjacent protrusions 200 is not limited, and may be designed according to actual process conditions. For example, in at least one embodiment of the present disclosure, as shown in FIG. 4, a difference between the height H of the second protrusion 220 and the height h of the first protrusion 210 is about 0.3 to 5 microns, and for example, further about 0.5 to 3 microns.

In the embodiments of the present disclosure, a size of the protrusion 200 is not limited, and may be designed according to actual process conditions. For example, in at least one embodiment of the present disclosure, as shown in FIG. 4, the height of the protrusion 200 in the direction parallel to the Z axis is about 2 to 15 microns. As shown in FIG. 4, the height of the protrusion 200 is the distance from one end of the protrusion 200, which is away from the base 100, to the other end of the protrusion 200, which is close to the base 100, and the height of the protrusion 200 is the distance from one end of the protrusion 200, which is away from the base 100, to the other end positioned on the passivation layer 400. For example, in at least one embodiment of the present disclosure, as shown in FIG. 4, a width W of the protrusion 200 in the direction parallel to the plane where the base 100 is positioned is about 30 to 100 microns; for example, in at least one embodiment of the present disclosure, as shown in FIG. 4, in the direction parallel to the plane where the base 100 is positioned, a spacing distance S between the adjacent protrusions 200 (for example, the first protrusion 210 and the second protrusion 220) is about 30 to 100 microns.

In the embodiments of the present disclosure, the insulating layer (the protrusion is arranged on the insulating layer) in the display substrate is not limited to the passivation layer in the above-mentioned embodiments. FIG. 6 is a partial sectional view of another display substrate provided by an embodiment of the present disclosure.

For example, in at least one embodiment of the present disclosure, as shown in FIG. 6, the insulating layer in the display substrate may be the interlayer insulating layer 820, and the protrusion 200 may be set to be in contact with the interlayer insulating layer 820. For example, in the embodiments of the present disclosure, the passivation layer may not need to be arranged in the display substrate, so that arrangement of the protrusion 200 not only can increase the paths for water, oxygen and the like to intrude into the inside of the display substrate and improve the packaging effect of the display substrate, but also can reduce the thickness of the display substrate and is beneficial to thinning and lightening of the display substrate; moreover, the complexity of the structure of the display substrate, which is positioned in the non-display region 120, is also reduced, and in the process of carrying out operations of bending and the like on the display substrate (for example, the display substrate is a flexible display substrate), a probability that the display substrate in the non-display region 120 is damaged (for example, a crack generated by fracture) can be reduced so as to prevent water, oxygen and the like from intruding into the inside of the display substrate along the crack.

For example, in at least one embodiment of the present disclosure, as shown in FIG. 6, the planarization layer 500 may be arranged on the interlayer insulating layer 820 to replace the passivation layer 400 as shown in FIG. 2. The arrangement mode of the interlayer insulating layer 500 may refer to the related contents in the above-mentioned embodiments (the embodiments as shown in FIG. 3A and FIG. 3B), and the embodiments of the present disclosure will not repeat it herein.

At least one embodiment of the present disclosure provides a display device, and the display device includes the display substrate in any one of the above-mentioned embodiments. For example, the display substrate in the display device may be a flexible substrate so as to be applied to the field of flexible display. For example, in the display device provided by the embodiments of the present disclosure, a touch substrate may be arranged on the display substrate so as to enable the display device to have a touch display function.

For example, the display device may be any product or component with a display function, e.g., a television, a digital camera, a mobile phone, a watch, a tablet personal computer, a notebook computer, a navigator and the like.

It should be noted that in order to show clearly, all structures of the display device are not illustrated. In order to achieve necessary functions of the display apparatus, those skilled in the art may arrange other structures according to specific application scenarios, and the present disclosure does not make any limit thereto.

At least one embodiment of the present disclosure provides a manufacturing method of a display substrate, including: providing a base, the base including a display region and a non-display region positioned around the display region; forming at least one protrusion in the non-display region of the base; and forming a packaging layer on the base, wherein the protrusion is formed between the base and the packaging layer, and the packaging layer at least partially covers the protrusion. In the display substrate obtained according to the above-mentioned manufacturing method, in the non-display region of the display substrate, the protrusion increases a surface area of a surface of the packaging layer, which faces the base, and increases paths for substances such as water, oxygen and the like to intrude into the inside of the display substrate so as to protect components in the display substrate; in addition, arrangement of the protrusion increases a contact area between the packaging layer and the display substrate so as to improve arrangement firmness of the packaging layer on the display substrate and improve the packaging effect of the display substrate.

For example, a manufacturing method provided by at least one embodiment of the present disclosure further includes: forming an insulating layer between the protrusion and the base, wherein the protrusion is in contact with the insulating layer, and the insulating layer is a passivation layer or an interlayer insulating layer. Therefore, the protrusion can increase a surface area of an interface between the packaging layer and the passivation layer or the interlayer insulating layer and increase the paths for water, oxygen and the like to intrude into the inside of the display substrate along the interface.

For example, a manufacturing method provided by at least one embodiment of the present disclosure further includes: forming a planarization layer on one side of the insulating layer, which is away from the base, the planarization layer being formed between the protrusion and the insulating layer, and at least a portion of the protrusion being manufactured on the same layer and from the same material with the planarization layer. Therefore, a height of the protrusion can be increased, so as to further increase the paths for water and oxygen to intrude and improve the packaging effect of the display substrate.

It should be noted that the structure of the display substrate obtained according to the above-mentioned manufacturing method may refer to the related contents in the above-mentioned embodiments, and is not repeated herein.

The embodiments of the present disclosure provide the display substrate and the manufacturing method thereof, and the display device, and can have at least one of the advantageous effects as follows:

(1) In the display substrate provided by at least one embodiment of the present disclosure, the protrusion arranged in the non-display region can increase the area of the surface of the packaging layer, which faces the base, increase the paths for water, oxygen and the like to intrude into the inside of the display substrate and improve the packaging effect of the display substrate.

(2) In the display substrate provided by at least one embodiment of the present disclosure, arrangement of the protrusion can improve stable fixation of the packaging layer on the display substrate and improve the packaging effect of the display substrate.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or a region may be enlarged, that is, the accompanying drawings are not drawn according to the actual scale.

(3) In case of no conflict, features in one embodiment or in different embodiments can be combined to obtain a new embodiment.

What are described above is related to the specific embodiments of the disclosure only and not limitative to the scope of the disclosure. The protection scope of the disclosure shall be based on the protection scope of the claims.

The invention claimed is:

1. A display substrate, comprising:
    a base, comprising a display region and a non-display region around the display region;
    at least one protrusion on the base in the non-display region, configured to retard invasion of moisture and oxygen into the display region; and
    wherein the at least one protrusion is on at least one side of the display region,
    wherein the at least one protrusion includes a first protrusion and a second protrusion which are sequentially arranged around the display region, the first protrusion and the second protrusion are adjacently arranged, and the first protrusion is positioned inside the second protrusion, wherein the height of the protrusion is 2 to 15 microns; and in the direction parallel to the plane where the base is positioned, a spacing between the first protrusion and the second protrusion is 30 to 100 microns.

2. The display substrate according to claim 1, further comprising:

an insulating layer arranged between the protrusion and the base.

3. The display substrate according to claim 2, wherein the insulating layer is a protection layer, and the protrusion is in contact with the protection layer; or the insulating layer is an interlayer insulating layer for electrical isolating a source-drain electrode of a thin film transistor and a gate electrode of the thin film transistor, and the protrusion is in contact with the interlayer insulating layer.

4. The display substrate according to claim 1, further comprising:

a pixel defining layer in the display region, configured to define a region where the organic light-emitting diode is located, wherein at least a portion of the protrusion is configured to be positioned on a same layer as the pixel defining layer and be manufactured from a same material with the pixel defining layer.

5. The display substrate according to claim 4, wherein the protrusion is configured to be a lamination at least including a first protrusion layer and a second protrusion layer, and the first protrusion layer is positioned between the second protrusion layer and the base, wherein the first protrusion layer is configured to be positioned on a same layer as the pixel defining layer and be manufactured from a same material with the pixel defining layer.

6. The display substrate according to claim 2, wherein a preparation material of the protrusion includes the photoresist material.

7. The display substrate according to claim 4, further comprising:

a planarization layer arranged on one side of the insulating layer, which is away from the base, wherein the planarization layer is positioned between the protrusion and the insulating layer, wherein an orthogonal projection of the protrusion on the base is positioned within an orthogonal projection of the planarization layer on the base, wherein at least a portion of the protrusion is configured to be positioned on a same layer as the planarization layer and be manufactured from a same material with the planarization layer.

8. The display substrate according to claim 7, wherein the protrusion is configured to be a lamination at least including a first protrusion layer, a second protrusion layer and a third protrusion layer, the first protrusion layer is positioned between the second protrusion layer and the base, and the third protrusion layer is positioned between the first protrusion layer and the base, wherein the first protrusion layer is configured to be positioned on a same layer as the pixel defining layer and be manufactured from a same material with the pixel defining layer, and the third protrusion layer is configured to be positioned on a same layer as the planarization layer and be manufactured from a same material with the planarization layer, wherein a preparation material of the second protrusion layer is a photoresist material.

9. The display substrate according to claim 1, wherein the protrusion is set to be of a ring-shaped structure and surrounds the display region, wherein the protrusion is set to be of an integrated closed ring-shaped structure; or the protrusion is set to include at least two protrusion segments spaced from each other.

10. The display substrate according to claim 9, wherein on a same side of the displays substrate, a ratio of a length of the protrusion segment to a side length of the display substrate is not smaller than one third.

11. The display substrate according to claim 1, wherein in a direction perpendicular to a plane where the base is positioned, a height of the second protrusion is greater than that of the first protrusion.

12. The display substrate according to claim 11, wherein a difference between the height of the second protrusion and the height of the first protrusion is 0.5 to 3 microns.

13. The display substrate according to claim 1, wherein the packaging layer is configured to be a lamination including a first packaging layer, a second packaging layer and a third packaging layer which are sequentially arranged on the base, preparation materials of the first packaging layer and the third packaging layer include an inorganic material, and a preparation material of the second packaging layer includes an organic material, wherein the first packaging layer and the third packaging layer are configured to cover the protrusion; and the orthogonal projection of the protrusion on the base is positioned outside an orthogonal projection of the second packaging layer on the base.

14. A display device, comprising the display substrate according to claim 1.

15. A manufacturing method of a display substrate, comprising:

providing a base, the base including a display region and a non-display region positioned around the display region;

forming at least one protrusion in the non-display region of the base; and forming a packaging layer on the base, wherein the protrusion is formed between the base and the packaging layer, and the packaging layer covers at least a portion of the protrusion, wherein the at least one protrusion includes a first protrusion and a second protrusion which are sequentially arranged around the display region, the first protrusion and the second protrusion are adjacently arranged, and the first protrusion is positioned inside the second protrusion, wherein the height of the protrusion is 2 to 15 microns; and in the direction parallel to the plane where the base is positioned, a spacing between the first protrusion and the second protrusion is 30 to 100 microns.

16. A display device according to the claim 14, further comprising: a packaging layer, arranged on the base, the protrusion being positioned between the base and the packaging layer, and the packaging layer covering at least a portion of the protrusion.

17. The display substrate according to claim 1, wherein the at least one protrusion continuously surround the display region.

18. The display substrate according to claim 1, wherein the at least one protrusion comprises at least two segments spaced from each other, the at least two segments are disposed to surround the display region.

* * * * *